United States Patent
Liu et al.

(10) Patent No.: US 8,421,204 B2
(45) Date of Patent: Apr. 16, 2013

(54) EMBEDDED SEMICONDUCTOR POWER MODULES AND PACKAGES

(75) Inventors: Yong Liu, Scarborough, ME (US); Qiuxiao Qian, Jiangsu (CN); Yumin Liu, Shanghai (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/110,865

(22) Filed: May 18, 2011

(65) Prior Publication Data

US 2012/0292778 A1  Nov. 22, 2012

(51) Int. Cl.
*H01L 23/52* (2006.01)
*H01L 21/00* (2006.01)

(52) U.S. Cl.
USPC ............ 257/690; 257/E23.01; 438/106

(58) Field of Classification Search .......... 257/678, 257/687, 690, E23.01; 438/106, 107, 110
See application file for complete search history.

(56) References Cited

U.S. PATENT DOCUMENTS

| | | | |
|---|---|---|---|
| 3,956,821 A | 5/1976 | Martin | |
| 4,058,899 A | 11/1977 | Phy | |
| 4,191,943 A | 3/1980 | Cairns et al. | |
| 4,671,984 A * | 6/1987 | Maeda et al. | 428/209 |
| 4,680,613 A | 7/1987 | Daniels et al. | |
| 4,720,396 A | 1/1988 | Wood | |
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 5,327,325 A | 7/1994 | Nicewarner, Jr. | |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,432,750 B2 | 8/2002 | Jeon et al. | |
| 6,449,174 B1 | 9/2002 | Elbanhawy | |
| 6,489,678 B1 | 12/2002 | Joshi | |
| 6,556,750 B2 | 4/2003 | Constantino et al. | |

(Continued)

OTHER PUBLICATIONS

Thorsten Meyer, et al., "Embedded Wafer Level Ball Grid Array (eWLB)," Presentation slides for a presentation in Singapore at the 2008 Electronics Packaging Technology Conference (EPTC 2008), Dec. 9, 2008, 24 pages, Organized by the IEEE, Singapore.

(Continued)

*Primary Examiner* — Nikolay Yushin
(74) *Attorney, Agent, or Firm* — Hiscock & Barclay, LLP

(57) ABSTRACT

Disclosed are semiconductor die packages constructed from modules of embedded semiconductor dice and electrical components. In one embodiment, a semiconductor die package comprises a first module and a second module attached to the first module. One or more semiconductor dice are embedded in the first module, and one or more electrical components, such as surface-mounted components, are embedded in the second module. The first module may be formed by a lamination process, and the second module may be formed by a lamination process or a molding process. Patterned metal layers and vias provide electrical interconnections to the package and among the die and components of the package. The second module may be attached to the first module by coupling interconnect lands of separately manufactured modules to one another, or may be directly attached by lamination or molding.

26 Claims, 10 Drawing Sheets

U.S. PATENT DOCUMENTS

| | | |
|---|---|---|
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,633,030 B2 | 10/2003 | Joshi |
| 6,645,791 B2 | 11/2003 | Noquil et al. |
| 6,674,157 B2 | 1/2004 | Lang |
| 6,683,375 B2 | 1/2004 | Joshi |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 2006/0278970 A1* | 12/2006 | Yano et al. .............. 257/700 |
| 2008/0169544 A1* | 7/2008 | Tanaka et al. ............ 257/686 |
| 2009/0079092 A1 | 3/2009 | Liu et al. |
| 2009/0140179 A1 | 6/2009 | Liu et al. |
| 2009/0140266 A1 | 6/2009 | Liu et al. |
| 2009/0173953 A1 | 7/2009 | Liu et al. |
| 2009/0174048 A1 | 7/2009 | Liu et al. |
| 2009/0256245 A1 | 10/2009 | Liu et al. |
| 2009/0256252 A1* | 10/2009 | Liu et al. ................ 257/698 |
| 2009/0315162 A1 | 12/2009 | Liu et al. |
| 2009/0315163 A1 | 12/2009 | Johnson et al. |
| 2010/0123257 A1 | 5/2010 | Liu |
| 2010/0193803 A1 | 8/2010 | Liu et al. |
| 2010/0230792 A1 | 9/2010 | Irving et al. |
| 2011/0147917 A1 | 6/2011 | England et al. |

OTHER PUBLICATIONS

Daoguo Yang, et al., "Reliability Modeling on a MOSFET Power Package Based on Embedded Die Technology," Presentation paper at the International Conference on Thermal, Mechanical and Multi-Physics Simulation and Experiments in Microelectronics and Microsystems (EuroSimE 2009), Apr. 27, 2009, 6 pages, Sponsored by the IEEE, Delft, The Netherlands.

U.S. Appl. No. 13/166,697, filed Jun. 22, 2011, Liu, et al.

* cited by examiner

EMBEDDED SEMICONDUCTOR POWER MODULES AND PACKAGES

CROSS-REFERENCES TO RELATED APPLICATIONS

None

BACKGROUND OF THE INVENTION

Personal electronic products, such as cell phones, personal data assistants, digital cameras, laptops, etc., are generally comprised of several packaged semiconductor IC chips and surface-mounted components assembled onto interconnect substrates, such as printed circuit boards and flex substrates. There is an ever-increasing demand to incorporate more functionality and features into personal electronic products and the like. This, in turn, has placed ever-increasing demands on the design, size, and assembly of the interconnect substrates. As the number of assembled components increases, substrate areas and costs increase, while demand for a smaller form factor increases.

BRIEF SUMMARY OF THE INVENTION

As part of making their invention, the inventors have recognized that there is a need to address these issues and that it would be advantageous to find ways to enable increases in functionality and features of electronic products without causing increases in substrate areas and costs, and decreases in product yields. Also, as a part of making their inventions, the inventors have recognized that many electronic products have several components that can be grouped together in several small groups that provide specific functions. For example, an electronic product often has one or more power conversion circuits, each of which typically comprises a control IC chip, multiple MOSFET and/or IGBT dice, an inductor, one or two capacitors, and sometimes a resistor or two. As another example, an electronic product may have an analog-to-digital circuit and/or a digital-to-analog circuit, each of which typically comprises an IC chip, and several resistors and capacitors. Also, as part of making their invention, the inventors have discovered that the substrate area required for a circuit group can be significantly decreased by incorporating the components of the circuit group into a single package.

The present invention enables low-cost, functionally complex semiconductor packages to be manufactured by providing a modular construction architecture of modules with embedded semiconductor die and electrical components. In one exemplary embodiment, a semiconductor die package comprises a first module and a second module attached to the first module. One or more semiconductor dice are embedded in the first module, and one or more electrical components, such as surface-mounted components, are embedded in the second module. The first module may be formed by a lamination process, and the second module may be formed by a lamination process or a molding process. Patterned metal layers and vias provide electrical interconnections to the package and among the dice and components of the package. The second module may be attached to the first module by coupling interconnect lands of separately manufactured modules to one another, or may be directly attached by lamination or molding. A semiconductor die package may comprise more than one instance of a first module and/or more than one instance of a second module, where the instances may have different types of dice, components, and interconnections.

An exemplary semiconductor die package comprises a first module having a first major surface, a second major surface, a plurality of first interconnect lands disposed at its first major surface, a plurality of second interconnect lands disposed at its second major surface, a first semiconductor die disposed between the first and second major surfaces, a first layer of electrically insulating material disposed between the first and second major surfaces and around the first semiconductor die, and a second layer of electrically insulating material disposed between the first layer and the first major surface and over the first semiconductor die. The first layer of electrically insulating material preferably comprises a pre-impregnated material. The first module further comprises a plurality of first electrically conductive vias disposed through the second layer of electrically insulating material and electrically coupled to a plurality of conductive regions of the first semiconductor die, and a plurality of second electrically-conductive vias disposed through the first and second layers of electrically insulating material and electrically coupled to at least some of the second interconnect lands, wherein at least one first electrically-conductive via is electrically coupled to at least one second electrically conductive via, and wherein at least one second electrically-conductive via is electrically coupled to at least one first interconnect land. The exemplary semiconductor die package further comprises a second module having a first major surface, a second major surface, a first electrical component disposed between the first and second major surfaces, and a third layer of electrically insulating material disposed between the first and second major surfaces of the second module and around the first electrical component. The second module is disposed over the first module with its first major surface facing the first major surface of the first module, and the first electrical component is electrically coupled to the first semiconductor die by way of at least one of the first interconnect lands of the first module.

In one embodiment, the second module further comprises a plurality of third interconnect lands disposed at the first major surface of the second module, the first electrical component being electrical coupled to at least one of the third interconnect lands. Also in this embodiment, the semiconductor die package further comprises a plurality of bodies of conductive adhesive disposed between a plurality of the third interconnect lands and a plurality of the first interconnect lands of the first module.

In another embodiment, the second module is laminated onto the first module. In this embodiment, the first electrical component has at least two electrical terminals that are disposed on and attached to respective first interconnect lands of the first module, and the third layer of electrically insulating material is laminated to the second layer of electrically insulating material.

In another embodiment, the second module is molded onto the first module. In this embodiment, the first electrical component has at least two electrical terminals that are disposed on and attached to respective first interconnect lands of the first module, and the third layer of electrically insulating material comprises a molding material that is molded over the first electrical component and the second layer of electrically insulating material.

The above exemplary embodiments and other embodiments of the inventions are described in the Detailed Description with reference to the Figures. In the Figures, like numerals may reference like elements and descriptions of some elements may not be repeated.

DETAILED DESCRIPTION OF THE INVENTION

Figure 1:
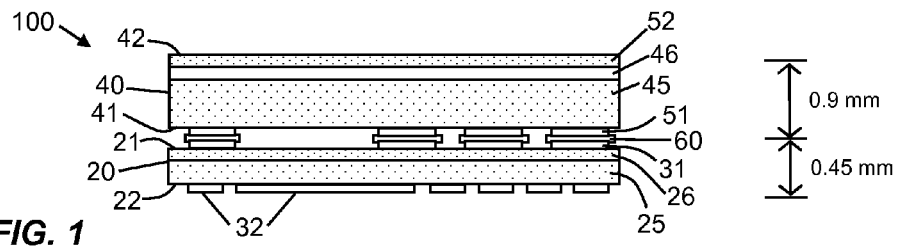
FIG. 1 shows a side view of a first exemplary semiconductor die package according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

FIG. 1 shows a side view of a first exemplary embodiment 100 of a semiconductor die package according to the present invention. Package 100 comprises a first module 20 and a second module 40 disposed over first module 20 and attached thereto. First module 20 has a first major surface 21, a second major surface 22 opposite to its first major surface, and a plurality of sides disposed between its major surfaces. First module 20 further has a plurality of first interconnect lands 31 disposed at its first major surface 21, a plurality of second interconnect lands 32 disposed at its second major surface 22, a first layer 25 of electrically insulating material disposed over the top sides of lands 32, and between the module's major surfaces 21-22, and a second layer 26 of electrically insulating material disposed between first layer 25 and first major surface 21, and at least one semiconductor die (shown and described below in greater detail) embedded within module 20 between major surfaces 21-22, and electrically coupled to at least some of lands 31 and 32. Second module 40 has a first major surface 41, a second major surface 42 opposite to its first major surface, and a plurality of sides disposed between its major surfaces. Second module 40 further has a plurality of interconnect lands 51 disposed at its first major surface 41, a heat spreader structure 52 disposed at its second major surface 42, a first layer 45 of electrically insulating material disposed over the top sides of lands 51, and between the module's major surfaces 41-42, and a second layer 46 of electrically insulating material disposed between first layer 45 and second major surface 42, and at least one electrical component (shown and described below in greater detail) embedded within second module 40 between its major surfaces 41-42, and electrically coupled to at least some of lands 51. The at least one electrical component is electrically coupled to the at least one semiconductor die by way of one or more first interconnect lands 31 of first module 20. The electrical components in second module 40 may comprise surface-mounted resistors, surface-mounted capacitors, and surface-mounted inductors, which are passive electrical components. Second module 40 has a set of first interconnect lands 51 that face a respective set of first lands 31 of first module 20, and are electrically coupled thereby by respective bodies 60 of conductive adhesive. The conductive adhesive may comprise solder, silver paste, or the like.

Figure 2:
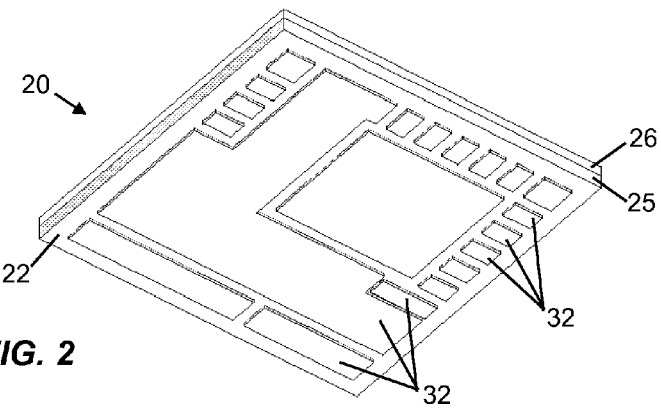
FIG. 2 shows a bottom perspective view of an exemplary first module according to the present invention.
Figure 3:
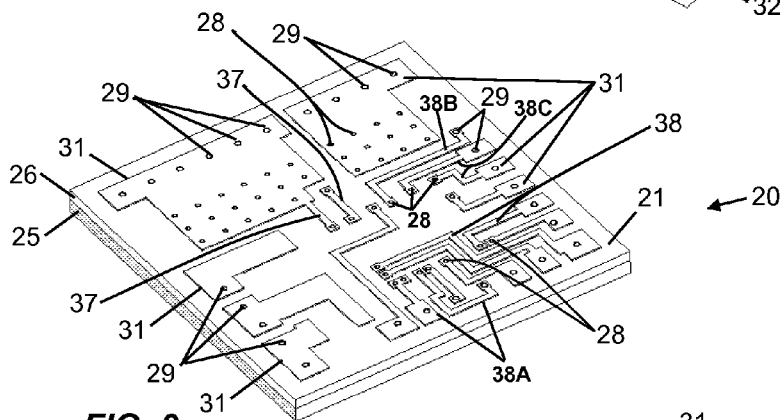
FIGS. 3-4 show top perspective views of an exemplary first module according to the present invention.
Figure 4:
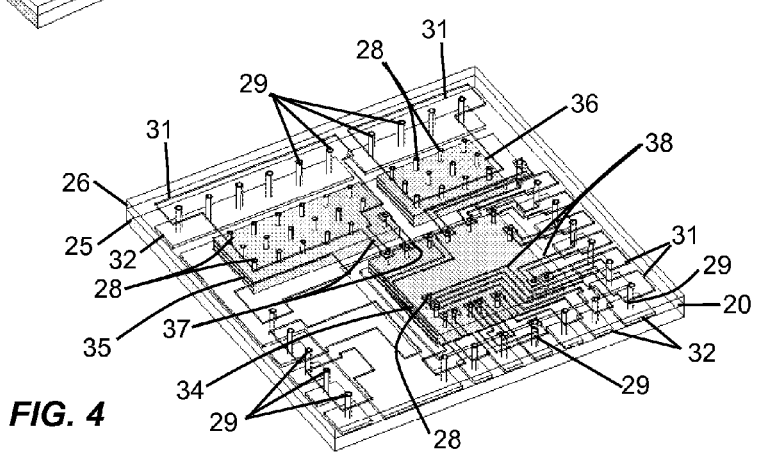

FIG. 2 shows a bottom perspective view of first module 20 with land 32 disposed at second major surface 22, and FIG. 3 shows a top perspective view of first module 20 with interconnect lands 31 and interconnects traces 37, 38, 38A, and 38B disposed at first major surface 21. As indicated above, electrically insulating layers 25 and 26 are disposed between the module's first and second major surface 21-22. FIG. 4 shows a top perspective view of first module 20 with layers 25 and 26 shown in transparent. As best seen in FIG. 4, first module 20 further comprises a first semiconductor die 34, a second semiconductor die 35, and a third semiconductor die 36, each die being disposed between the module's major surfaces 21-22. The backsides of die 34-36 may be attached to large lands 32 of the module that serve as die attach pads. The first layer 25 of electrically insulating material is disposed between the module's major surfaces 21-22 and around each of the semiconductor dice 34-36, and second layer 26 of electrically insulating material is disposed between first layer 25 and first major surface 21, and over the top surfaces of each of the semiconductor dice 34-36. First layer 25 of electrically insulating material may comprise a pre-impregnated material, which is cut with apertures for fitting layer 25 around the dice 34-36. As is known in the art, a pre-impregnated material is a composite material comprising a sheet of solid woven fibers that is impregnated with a liquid resin (e.g., matrix material). The liquid resin can be cured to an intermediate cure state or final cure state to bind the fibers together so that the array or weave of fibers substantially holds its shape. Second layer 26 of electrically insulating material may comprise an adhesive material that binds lands 31 to first layer 25 and/or dice 34-36.

Module 20 further comprises various structures to electrically interconnect semiconductor dice 34-36 to one another and to lands 31-32, and to interconnect selected ones of lands 31 and 32 to each other. Specifically, Module 20 has a first plurality of electrically-conductive vias 28 disposed through second layer 26 of electrically insulating material and electrically coupling at least some of the first interconnect lands 31 to a plurality of conductive regions at the top surfaces of semiconductor dice 34-36. These vias provide connections to the semiconductor dice. Module 20 also has a second plurality of electrically conductive vias 29 disposed through the first and second layers 25-26 of electrically insulating material and electrically coupling at least some of the first interconnect lands 31 to at least some of the second interconnect lands 32 at the second major surface 22. Vias 29 enable electrical connections to be made from lands 32 to second module 40 by way of some of lands 31. Also, in cooperation with a plurality of electrical signal traces 38 disposed at first major surface 21, vias 29 enable electrical connections to be made from lands 32 to semiconductor dice 34-36, as illustrated by traces 38A shown in FIG. 3. That is to say, a signal trace 38 may be coupled to one or more lands 31 and to one or more vias 28, as illustrated by trace 38B shown in FIG. 3. Lands 31 and traces 38 also enable electrical connections to be made from second module 40 to semiconductor dice 34-36, as illustrated by traces 38C shown in FIG. 3. Module 20 also has electrical signal traces 37 that, in conduction with some vias 28, enable electrical connections to be made between the semiconductor dice 34-36. Traces 37-38 are distinguishable from lands 31 in a number of respects. First, a trace 37 or 38 can have a length dimension, which is the dimension parallel to the current flow of the electrical signal, which is five or more times greater than the trace's width dimension, which is the dimension perpendicular to the current flow of the electrical signal conveyed by the trace. Second, traces 37-38 can have a width dimension that is substantially smaller than that needed for a land 31 to support a solder interconnection or conductive adhesive connection between substrates, such as width dimensions of less 250 microns, and less than 100 microns, and even less than 50 microns. Third, a trace 37-38 can have one or more 90-degree bends at various points along its length dimension. Fourth, a trace 37 may electrically couple conductive regions of two or more embedded dice together.

As described below in greater detail, first module 20 may be constructed from the following three thin layers: (1) a base layer of thin conductive foil upon which the semiconductor die are attached and from which lands 32 are formed; (2) a thin layer of electrically insulating material pre-impregnated with an adhesive (e.g., "pre-preg") that is disposed over the base conductive foil and that has cut-outs that fit around the semiconductor die (layer 25); and (3) an adhesive-coated top conductive foil disposed over the electrically insulating layer and the semiconductor die with the adhesive side (layer 26) of the top foil facing the semiconductor dice. Conductive vias 28 are formed between the top foil and the semiconductor dice 34-36, and conductive vias 29 are formed between the top and base foils. The top and base foils may be pattern etched to form the interconnect lands 31-32 and electrical traces 37-38 in the foils at the major surfaces 21-22. Lands 31-32 and traces 37-38 may have thicknesses of 40 microns or less, and may even have thicknesses of 20 microns or less. (In contrast, typical lead frames have thicknesses of 100 microns or more.) First electrically insulating layer 25 may have a thickness equal to the thickness of the thickest semiconductor die plus the thickness of the adhesive underlying the die, the total typically ranging between 125 microns to 700 microns, and more typically between 225 microns and 550 microns. Second electrically insulating layer 26 may have a thickness in the range of 25 microns to 125 microns. Accordingly, with this construction, first module 20 may be made very thin, much thinner than lead frame based packages, and with excellent electrical interconnections among the semiconductor dice and lands of the module. First module 20 may have a thickness of 0.45 mm or less, which is flexible enough to conform to the non-planar surfaces of a motherboard or flexible circuit board, and to be manufactured into a roll of modules by a strip-based manufacturing process. The construction of first module 20 also eliminates the need for expensive molding processes, which reduces manufacturing costs. The three layers used to form module 20 easily withstand the high temperatures of soldering processes (much better than many molded packages), and enables package 100 to be reworked by re-soldering module 20 to a different instance of second module 40, if needed. As an advantage over lead frame based packages, interconnect traces can be formed in both the base and top foils for first module 20, and in the base foil for second module 40 (described below), enabling a higher density of interconnect traces, and higher levels of functionality. Also, large lands 32 may be defined under each of dice 34-36, which in turn can be attached to heat spreaders of an opposing motherboard, which in turn enhances thermal cooling of the dice.

Figure 5:
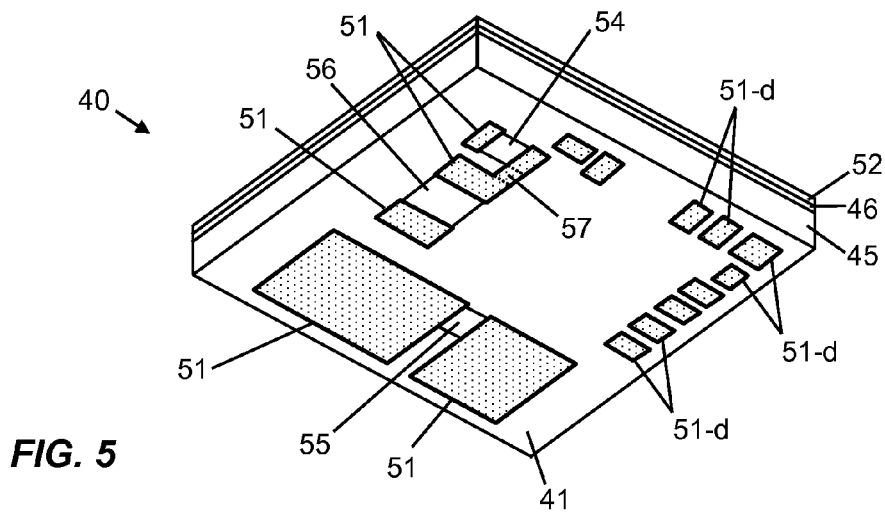
FIG. 5 shows a bottom perspective view of an exemplary second module according to the present invention.
Figure 6:
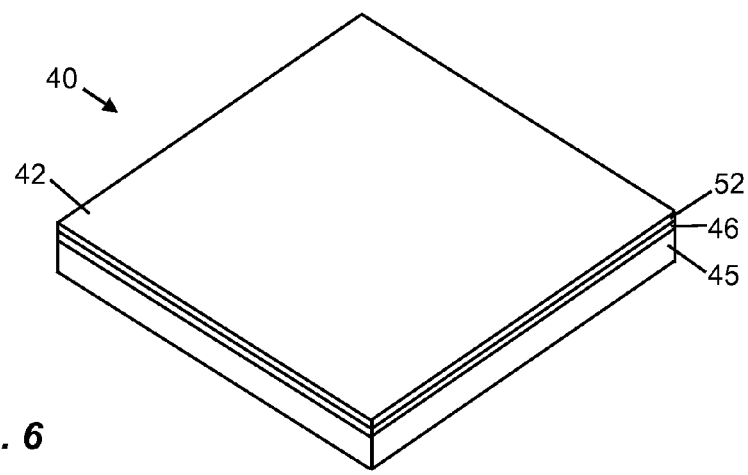
FIGS. 6-7 show top perspective views of an exemplary second module according to the present invention.
Figure 7:
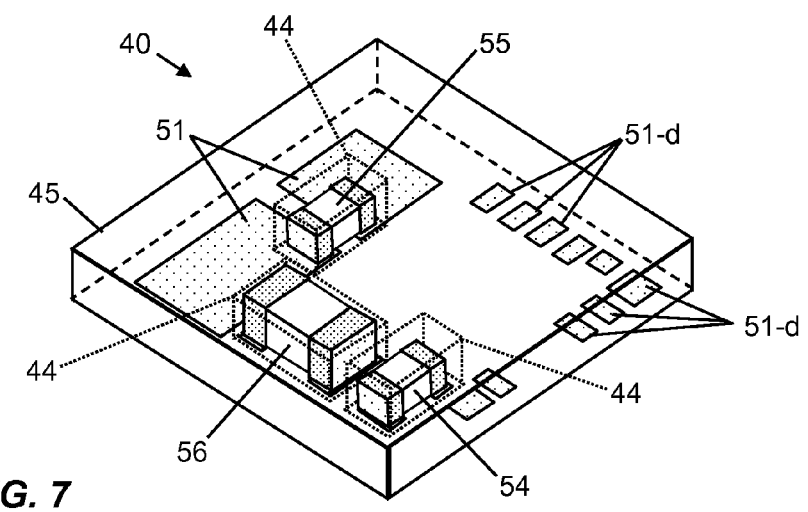

FIG. 5 shows a bottom perspective view of second module 40 with interconnect lands 51 and interconnects traces 57 disposed at first major surface 42, and FIG. 6 shows a top perspective view of second module 40 with heat spreader 52 disposed at second major surface 42. As indicated above, electrically insulating layers 45 and 46 are disposed between the module's first and second major surface 41-42. FIG. 7 shows a top perspective view of second module 40 with first layer 45 shown in transparent form, and with second layer 46 and heat spreader 52 omitted. As best seen in FIG. 7, second module 40 further comprises a first electrical component 54, a second electrical component 55, and a third electrical component 56, each electrical component being disposed between the module's major surfaces 41-42. Each electrical component may comprise a surface-mounted resistor, a surface-mounted capacitor, a surface-mounted inductor, or other type of electrical component having two or more terminals. For example, the smaller components 54-55 may comprise capacitors, and the larger component 56 may comprise an inductor. These are examples of passive electrical components. The undersides of the terminals of components 54-56 may be attached to the top sides of selected lands 51 of the module. First layer 45 of electrically insulating material is disposed over the top sides of lands 51, and between the module's major surfaces 41-42 and around each of the components 54-56, and second layer 46 of electrically insulating material is disposed between first layer 45 and first major surface 41, and over the top surfaces of each of the components 54-56. Second layer 46 serves to electrically insulate the upper sides of the terminals of components 54-56 from heat spreader 52 when the heat spreader comprises a metal. Second layer 46 and heat spreader 52 may be implemented by a resin-coated copper foil, where the copper foil provides heat spreader 52, and the layer of resin on the copper foil provides second layer 46. The resin layer is an electrically insulating material and an adhesive that binds heat spreader 52 to first layer 45 and to one or more of the components 54-56, when the components are tall enough to reach the resin layer. First layer 45 of electrically insulating material may comprise a pre-impregnated material, which is cut with apertures 44 for fitting first layer 45 over and around the components 54-56. Such pre-impregnated material was described above.

Referring to FIGS. 5 and 7, the bottom surfaces of lands 51 provide electrical connections of the components 54-56 to first module 20 at selected lands 31 thereof. Second module 40 may also comprise dummy lands 51-d for connection to corresponding lands 31 on first module 20. A dummy land 51-d is not electrically coupled to any component in second module 40, and thereby comprises an electrically isolated island. In a similar manner, a dummy land 31-d is not electrically coupled to any dice in first module 20. Because modules 20 and 40 are very thin, they can be very flexible, and can easily separate from one another if not attached to one another at all corners and edges of modules. As seen in FIG. 7, components 54-56 are concentrated at the left diagonal half of second module 40, and the lands 51 for the components provide good attachment of this half of the module to first module 20. On the other hand, there are no components on the right diagonal half of this example of second module 40, but the dummy lands 51-d in this half provide good attachment of this half of the module to first module 20. In addition to lands 51, second module 40 may comprise one or more signal traces 57 to electrically connect two or more of components 54-56 to one another. In this case, signal trace 57 electrically couples components 54 and 56 together at respective terminals thereof.

As described below in greater detail, second module 40 may be constructed from the following three thin layers: (1) a base layer of thin conductive foil upon which the electrical components are attached and from which lands 51 are formed, with the terminal of the components electrically coupled to the lands 51; (2) a thin layer of electrically insulating material pre-impregnated with an adhesive (e.g., "prepreg") that is disposed over the base conductive foil and that has cut-outs that fit around the electrical components (layer 45); and (3) an adhesive-coated top conductive foil disposed over the electrically insulating layer and components 54-56 with the adhesive side (layer 46) of the top foil facing components 54-56. The base foil may be pattern etched to form the interconnect lands 51 and electrical traces 57 in the foil at major surface 41. With this construction, second module 40 may be made very thin, and with excellent electrical interconnections among the components and lands of the module. Lands 51 and traces 37 may have thicknesses of 40 microns or less, and may even have thicknesses of 20 microns or less, and heat spreader 52 may have a thickness in the range of 20 microns to 80 microns. First electrically insulating layer 45 may have a thickness equal to the thickness of the thickest electrical component plus the thickness of the adhesive underlying the component, the total typically ranging between 200 microns to 1,500 microns, and more typically between 400 microns and 750 microns. Second electrically insulating layer 46 may have a thickness in the range of 25 microns to 125 microns. Accordingly, second module 40 may have a thickness of 0.9 mm or less, and is flexible enough to conform to the non-planar surfaces of a motherboard or flexible circuit board, and to be manufactured into a roll of modules by a strip-based manufacturing process. The overall thickness of package 100 may therefore be 1.4 mm or less. The construction of second module 40 also eliminates the need for expensive molding processes, which reduces manufacturing costs. The three layers used to form module 40 easily withstand the high temperatures of soldering processes (much better than many molded packages), and enables package 100 to be reworked by re-soldering module 40 to a different instance of first module 20, if needed. As an advantage noted above, interconnect traces 57 can be formed in both the base and top foils for second module 40, to complement the traces made in the foils for first module 20, thereby enabling a higher density of interconnect traces, and higher levels of functionality. Also, the close proximity of heat spreader 52 to electrical components 54-56 enhances thermal cooling of these components. As a further advantage of the construction of modules 20 and 40, each of the modules may be electrically tested separately, and thereafter assembled together if they are properly functioning, thereby increasing overall manufacturing yield of package 100. Also, additional modules like module 20 may be included in package 100 to increase functionality, and these additional modules may comprise a mix of semiconductor dice and electrical components.

Figure 8:
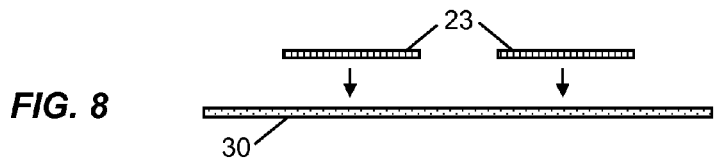
FIGS. 8-15 illustrate an exemplary method of manufacturing an exemplary first module according to the present invention.
Figure 9:
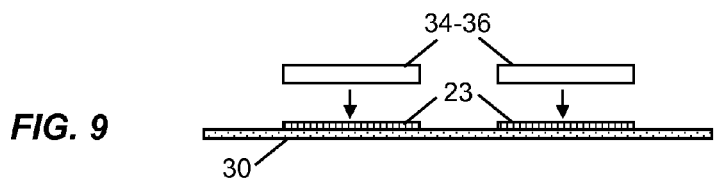
Figure 10:
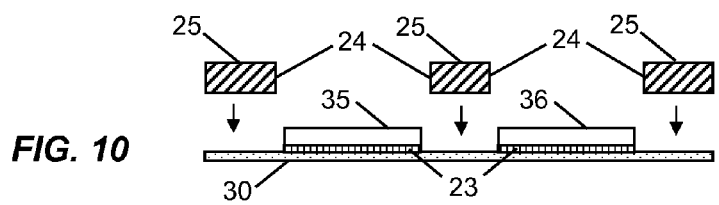
Figure 11:
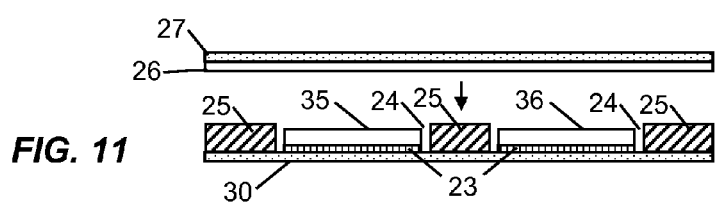

FIGS. 8-15 illustrate an exemplary method of manufacturing first module 20. Referring to FIG. 8, bodies 23 of an adhesive are disposed on selected locations of a conductive foil 30 where dice 34-36 are to be attached. Screen printing may be used for this. Conductive foil 30 may comprise a bare copper foil, and the adhesive may comprise a non-conductive epoxy, a conductive metal-filled epoxy (e.g., silver paste), or solder paste. Foil 30 may have thicknesses of 40 microns or less, and may even have thicknesses of 20 microns or less. (In contrast, typical lead frames have thicknesses of 100 microns or more.) Referring to FIG. 9, the semiconductor dice 34-36 are disposed on respective bodies 23 of adhesive and the adhesive is solidified, such as by adhesive curing or solder reflow, both of which may be done by exposing the bodies 23 to elevated temperatures of over 170° C. When solder is used for bodies 23, it may have a higher melting temperature than the melting temperature of conductive adhesive (e.g., solder) used for bodies 60 so as to facilitate reworking of package 100. Solidified adhesive bodies 23 may have thicknesses of 50 microns or less. Referring to FIG. 10, a layer 25 of electrically insulating material, with a plurality of apertures 24 formed therein is disposed on the exposed portions of conductive foil 30, with apertures 24 disposed around dice 34-36. Apertures 24 have dimensions that are slightly larger than the dimensions of the respective dice 34-36 that they surround, and layer 25 may have a thickness that is the same or larger than the thickness of the thickest die, or the combined thickness of the thickest die and the underlying body 23 of adhesive material. Layer 25 may comprise material pre-impregnated with adhesive resin that is partially cured (e.g., B-stage resin), or so-called "pre-preg" material. Subsequent heating of the layer, such as through a subsequent lamination process, allows the partially-cured resin at the surfaces of layer 25 to adhere to foil 30 and second layer 26, and to fully cure in a state of adhesion to foil 30 and second layer 26. Referring to FIG. 11, a composite layer of a conductive foil layer 27 with underlying resin layer 26 is disposed over first layer 25 and dice 34-36, and vacuum laminated thereto. Layer 26 is electrically insulating, and may comprise a partially-cured resin. The lamination process provides sufficient heat at elevated temperature to cause second layer 26 to adhere to first layer 25, dice 34-36, and layer 27, and to cause first layer 25 to adhere to conductive foil 30 and to second layer 26. Foil 27 may have thicknesses of 40 microns or less, and may even have thicknesses of 20 microns or less. Second electrically insulating layer 26 may have a thickness in the range of 25 microns to 125 microns.

Figure 12:
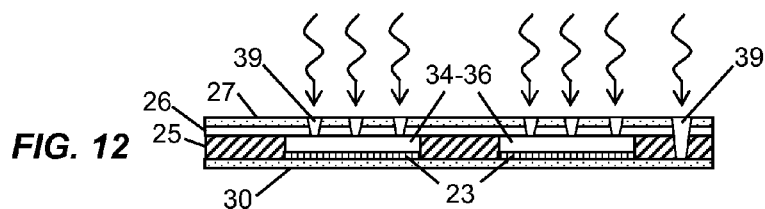
Figure 13:
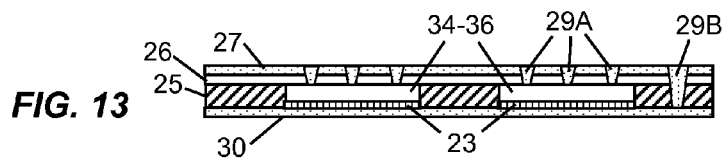
Figure 14:
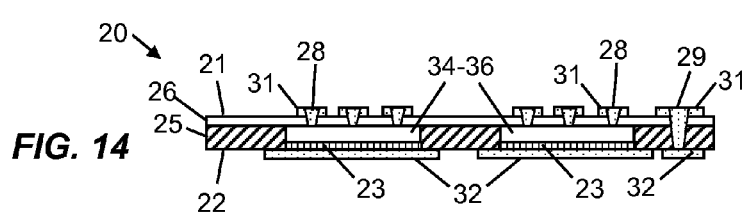
Figure 15:
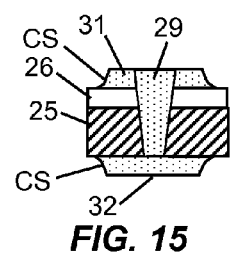

Referring to FIG. 12, a plurality of apertures 39 are formed through layers 25-27 by laser drilling (e.g., CO2 laser drilling) until the apertures reach the top surfaces of dice 34-36 or top surface of foil 30. Referring to FIG. 13, the apertures 39 are filled with conductive material, such as by sputtering, electroplating, or a combination of sputtering a thin layer followed by electroplating a thicker layer. The electroplating may comprise an electroless plating process, an electrolytic plating process (which uses a current source), or a combination of both (e.g., electroless plating of a thin layer followed by electrolytic plating of a thicker layer). Prior to electroplating, the exposed surfaces of layer 25 and 26 may be treated with conventional pre-plating solutions for non-conductive materials. The sputtering and/or electroplating processes act to fill in apertures 39 with conductive material; this conductive material electrically connects conductive regions of dice 34-36 to top foil 27, and electrically connects bottom foil 30 to top foil 27. Referring to FIG. 14, the exposed surfaces of foils 27 and 30 are pattern etched to define lands 31-32 and traces 37-38. The pattern etching process may comprise screen printing a patterned etch resist mask on the exposed surfaces of foils 27 and 30, exposing the exposed surface of the foils to a chemical etchant, followed by removing the etch resist masks with solvent. As seen in FIG. 15, the etching process produces lands 31-32 and traces 37-38 that have edges with curved surfaces CS, in contrast to the straight surfaces produced by leadframe stamping; typically, the curved surfaces CS spread outward as they approach layer 25 or layer 26.

Each of the above processes, taken individually, is known in the art and can be practiced by one of ordinary skill in the art without undue experimentation. In view of the disclosure herein, one of ordinary skill in the art will be able to practice the above combination and sequence of processes without undue experimentation. In addition, the above foils and layers may be provided as strips of material that are processed in one or more chains of machinery such that the combined material strips provide multiple instances of first modules 20, which can be separated (e.g., "singulated") from the combined strips at the ends of the processes or at a point during the sequence of processes. The strip processing enables the cost of production to be reduced.

Figure 16:
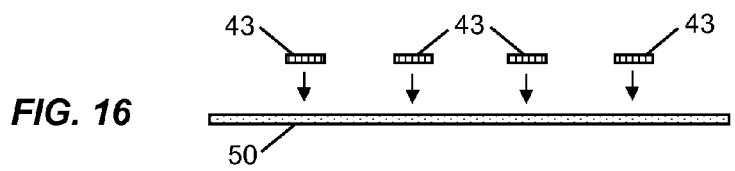
FIGS. 16-21 illustrate an exemplary method of manufacturing an exemplary second module according to the present invention.
Figure 17:
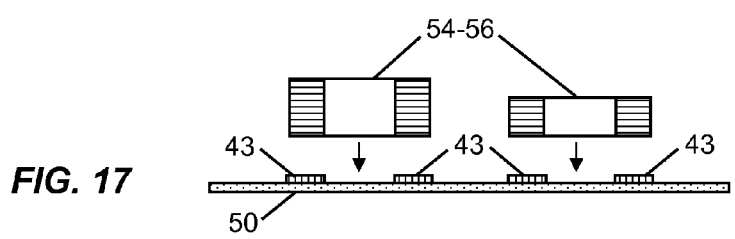

FIGS. 16-21 illustrate an exemplary method of manufacturing second module 40. Referring to FIG. 16, bodies 43 of a conductive adhesive may be disposed on selected locations of a conductive foil 50 where the terminals of electrical components 54-56 are to be attached. Screen printing may be used for this. Conductive foil 50 may comprise a bare copper foil, and the conductive adhesive may comprise a conductive metal-filled epoxy (e.g., silver paste), or solder paste. Foil 50 may have thicknesses of 40 microns or less, and may even have thicknesses of 20 microns or less. Referring to FIG. 17, components 54-56 are disposed on foil 50 such that their terminals contact respective bodies 43 of conductive adhesive, and the conductive adhesive is solidified, such as by adhesive curing or solder reflow, both of which may be done by exposing the bodies 43 to elevated temperatures of over 170° C. Solidified adhesive bodies 43 may have thicknesses of 50 microns or less. As another approach, components 54-56 may comprise surface-mounted components that have terminals that are pre-coated with bodies 43 of adhesive material. In this case, components 54-56 may be disposed on foil 50 without having to first dispose bodies 43 on foil 50; then, the conductive adhesive is solidified as before. In either case, when solder material is used for bodies 43, it may have a higher melting temperature (e.g., a reflow temperature of 260° C.) than the melting temperature of conductive adhesive (e.g., solder) used for bodies 60 so as to facilitate reworking of package 100 (e.g., removal of second module 40 from first module 20, and the subsequent attachment of another instance of first module 20 to second module 40, or another instance of second module 40 to first module 20).

Figure 18:
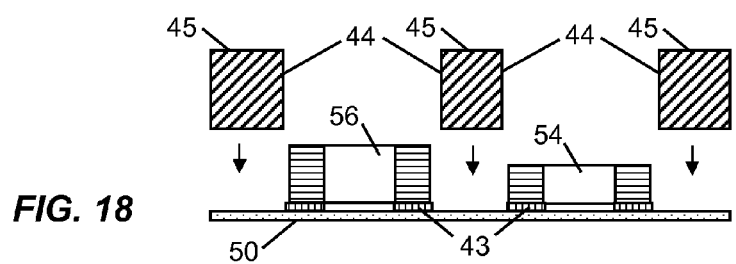

Referring to FIG. 18, a layer 45 of electrically insulating material, with a plurality of apertures 44 formed therein, is disposed on the exposed portions of conductive foil 50, with apertures 44 disposed around components 54-56. Apertures 44 have dimensions that are slightly larger than the dimensions of the components 54-56 that they surround, and layer 45 may have a thickness that is the same or larger than the thickness of the thickest components (e.g., component 56), or the combined thickness of the thickest component and the underlying body 43 of conductive adhesive material. Layer 45 may comprise material pre-impregnated with adhesive resin that is partially cured (e.g., B-stage resin), or so-called "pre-preg" material. Subsequent heating of the layer, such as through a subsequent lamination process, allows the partially-cured resin at the surfaces of layer 45 to adhere to foil 50 and second layer 46, and to fully cure in a state of adhesion to foil 50 and second layer 46.

Figure 19:
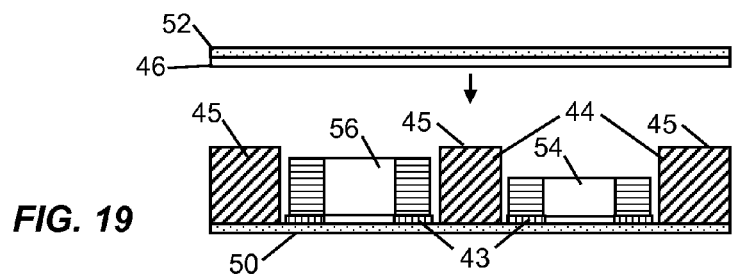
Figure 20:
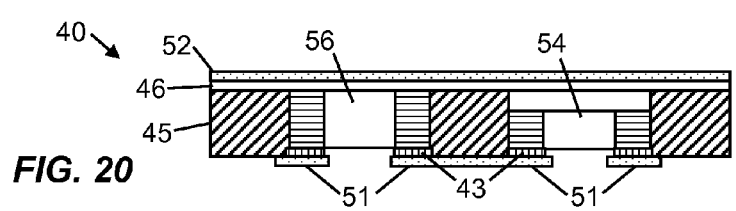
Figure 21:
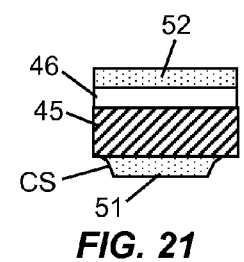

Referring to FIG. 19, a heat spreader layer 52 with underlying resin layer 46 is disposed over first layer 45 and components 54-56, and vacuum laminated thereto. Resin layer 46 is electrically insulating, and may comprise a partially-cured resin. Layer 52 may comprise a metal foil, such as a copper foil. The lamination process provides sufficient heat at elevated temperature to cause second layer 46 to adhere to first layer 45, components 54-56, and layer 52, and to cause first layer 45 to adhere to conductive foil 50 and to second layer 46. Layer 52 may have thicknesses in the range of 40 microns to 80 microns, and layer 46 may have a thickness in the range of 25 microns to 125 microns that may fill the gap between the component 54 and the layer 52 with resin layer 46 in the curing process. In the case of larger gap between component 54 and the metal layer 52 with resin layer 46, one may add a process step of screening printing with a epoxy resin to fill the gap before placing the resin copper coating (RCC) with copper layer 52 and the resin layer 46. Referring to FIG. 20, the exposed surface of foil 50 is pattern etched to define lands 51 and traces 57. The pattern etching process may comprise screen printing a patterned etch resist mask on the exposed surface of foil 50, exposing the exposed surface of the foil to a chemical etchant, followed by removing the etch resist mask with solvent. As seen in FIG. 21, the etching process produces lands 51 that have edges with curved surfaces CS, in contrast to the straight surfaces produced by leadframe stamping; typically, the curved surfaces CS spread outward as they approach layer 45.

Each of the above processes, taken individually, is known in the art and can be practiced by one of ordinary skill in the art without undue experimentation. In view of the disclosure herein, one of ordinary skill in the art will be able to practice the above combination and sequence of processes without undue experimentation. In addition, the above foils and layers may be provided as strips of material that are processed in one or more chains of machinery such that the combined material strips provide multiple instances of second modules 40, which can be separated (e.g., "singulated") from the combined strips at the ends of the processes or at a point during the sequence of processes. The strip processing enables the cost of production to be reduced.

Figure 22:
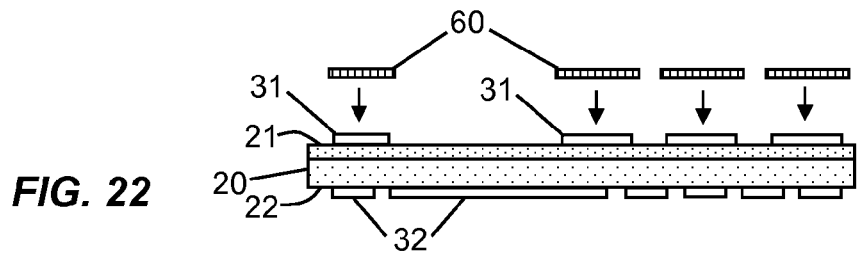
FIGS. 22-23 illustrate an exemplary method of manufacturing a first exemplary package according to the present invention.
Figure 23:
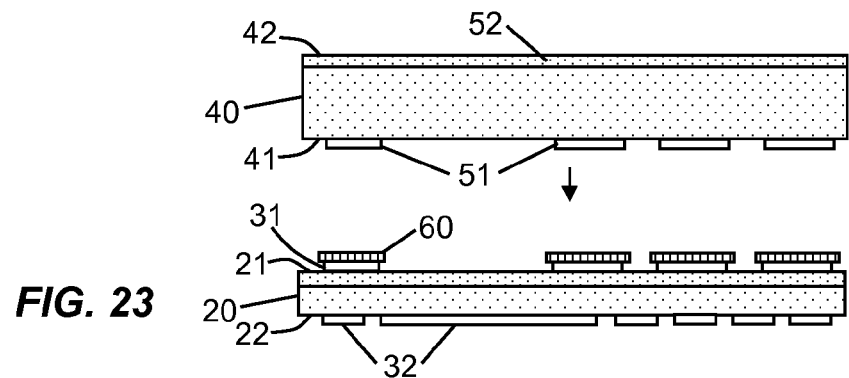

FIGS. 22-23 illustrate an exemplary method of manufacturing package 100 from first and second modules 20 and 40. Referring to FIG. 22, bodies 60 of a conductive adhesive are disposed on conductive lands 31 of first module 20. Screen printing may be used for this. Conductive adhesive 60 may comprise a conductive metal-filled epoxy (e.g., silver paste), or solder paste. As another approach, bodies 60 may be disposed on lands 51 of second module 40. Referring to FIG. 23, modules 20 and 40 are assembled together with bodies 60 disposed between their respective lands, and heat is applied at elevated temperature to cause bodies 60 to solidify and hold facing lands together and electrically couple them to one another. The process may comprise adhesive curing or solder reflowing, both of which may be done by exposing the bodies 60 to elevated temperatures of over 170° C. (curing temperatures), and may be done by a reflow process (e.g., 260° C.) for a solder paste. Solidified adhesive bodies 60 may have thicknesses of 50 microns or less.

Figure 24:
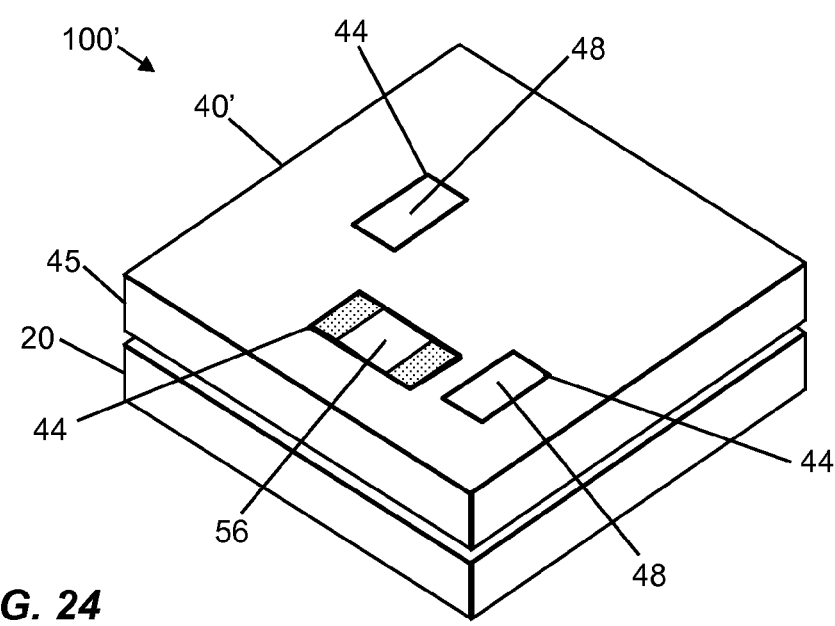
FIG. 24 shows a top perspective view of a modified first exemplary semiconductor die package using an exemplary modified second module according to the present invention.
Figure 25:
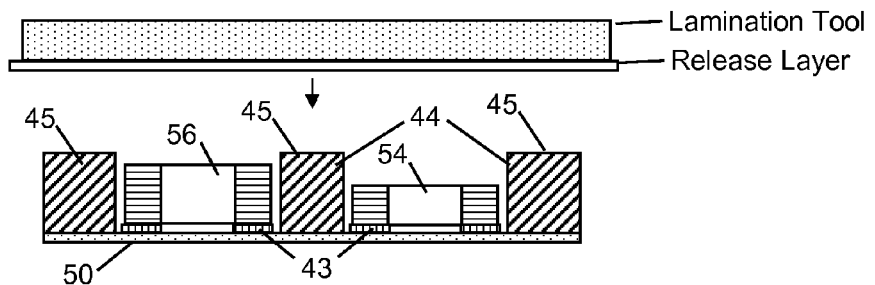
FIGS. 25-28 illustrate an exemplary method of manufacturing an exemplary modified second module according to the present invention.
Figure 26:
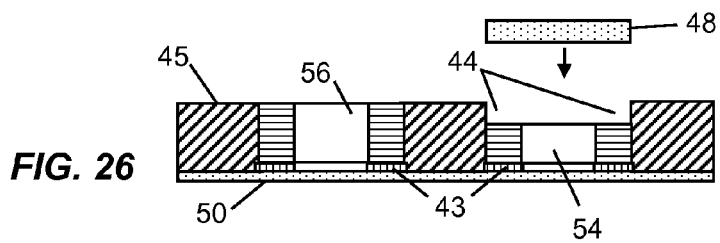
Figure 27:
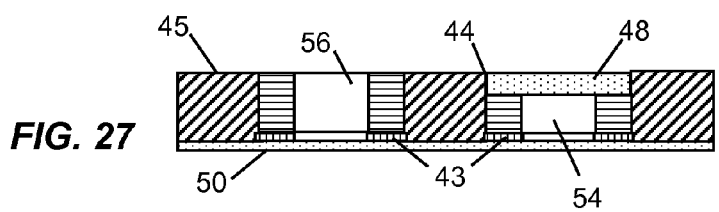
Figure 28:
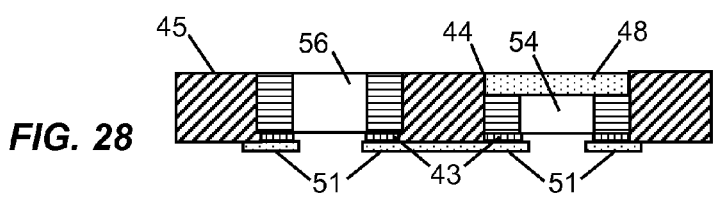
Figure 29:
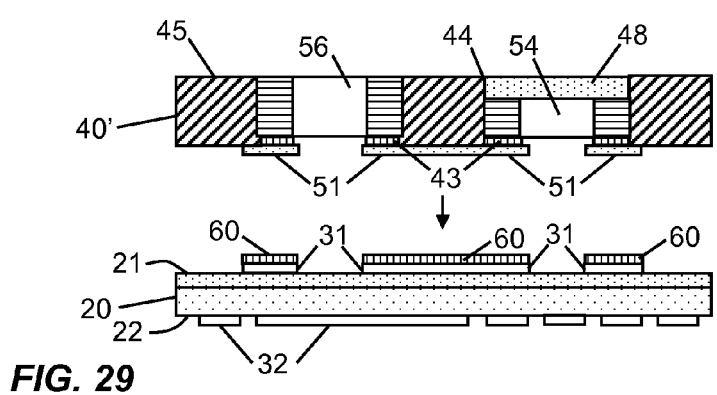
FIG. 29 illustrates an exemplary method of manufacturing a modified first exemplary semiconductor die package using an exemplary modified second module according to the present invention.

In a modified embodiment of package 100, heat spreader 52 is omitted from second module 40, with the top surface of the modified second module 40' being shown in FIG. 24. The top surface of the larger component 56 is left exposed. The top surfaces of the smaller components 54-55 may be covered by bodies of electrically insulating material 48 disposed at the tops of apertures 44 (called the remaining apertures in the claims). Second module 40' may be constructed with the processes illustrated in FIGS. 16-18 for module 40. After layer 45 is disposed on foil 50, it is laminated onto foil 50 using a lamination tool and a release layer disposed between layer 45 and the lamination tool, as shown in FIG. 25. After the lamination process, the release layer is removed. The same lamination process described above for second module 40 may be used here. The height of layer 45 may be reduced to the height of the highest component 56, as shown in FIG. 26. Next, as shown in FIG. 26, insulating material 48 is disposed in the remaining portions of apertures 44, which are disposed over the smaller components 54-55, so as to fill the apertures, as shown in FIG. 27. For this, a resin may be screen printed on the top surface of layer 45, and thereafter cured. At this point, foil layer 50 may be pattern etched as described above for module 40 in FIG. 20, thereby providing lands 51 and traces 57, thereby completing module 40', as shown in FIG. 28. Second module 40' may then be assembled with first module 20, as shown in FIG. 29, in the same way that second module 40 is assembled with first module 20, as described above.

Figure 30:
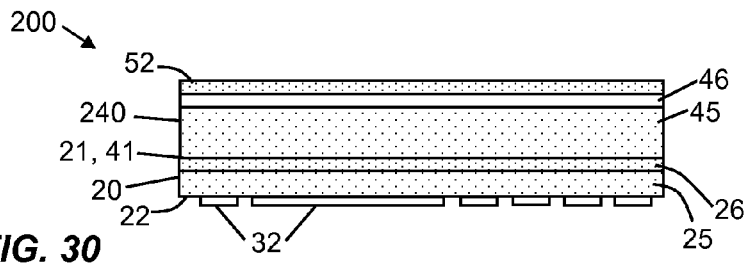
FIG. 30 shows a side view of a second exemplary semiconductor die package according to the present invention.

While first and second modules 20 and 40 are manufactured separately in the above package embodiments, in further package embodiments according to the present invention the second module is formed over first module 20 in a manner that eliminates adhesive bodies 60 and lands 51 of the second module. This embodiment is illustrated as package 200 in FIG. 30, where a second module 240 is built on top of first module 20. Except for lands 51, module 240 comprises the same elements as module 40. While package 200 does not allow for reworking the package by selective replacing one of the modules with a new instance, an advantage that package 100 has, package 200 has the advantage of reducing the number of processing steps and still has the advantage of providing for flexibility in the manufacturing process. And both of packages 100 and 200 reduce molding costs.

Figure 31:
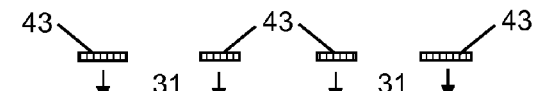
FIGS. 31-35 illustrate an exemplary method of manufacturing the second exemplary semiconductor die package according to the present invention.
Figure 32:
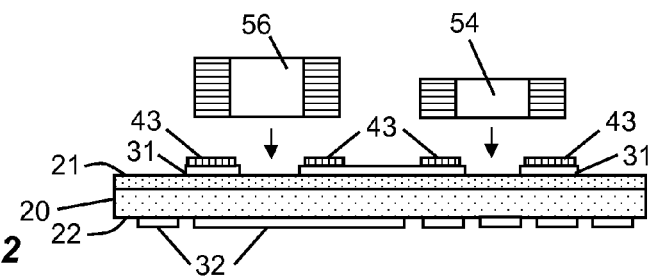

FIGS. 31-35 illustrate an exemplary method of manufacturing second module 240 and package 200. Referring to FIG. 31, bodies 43 of a conductive adhesive may be disposed on selected locations of lands 31 of first module 20 where the terminals of electrical components 54-56 are to be attached. Screen printing may be used for this. The conductive adhesive may comprise a conductive metal-filled epoxy (e.g., silver paste), or solder paste. Referring to FIG. 32, components 54-56 are disposed on selected lands 31 such that their terminals contact respective bodies 43 of conductive adhesive, and the conductive adhesive is solidified, such as by adhesive curing or solder reflow, both of which may be done by exposing the bodies 43 to elevated temperatures of over 170° C. As another approach, components 54-56 may comprise surface-mounted components that have terminals that are pre-coated with bodies 43 of adhesive material. In this case, components 54-56 can be disposed on selected lands 31 of first module 20 without having to first dispose bodies 43 on these lands; then, the conductive adhesive can be solidified as before. The solidified bodies 43 may have the thicknesses previously-indicated above.

Figure 33:
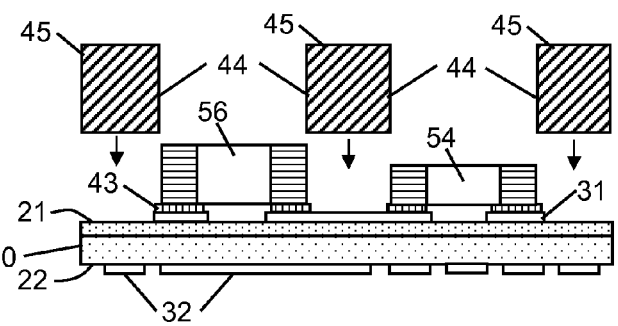

Referring to FIG. 33, a layer 45 of electrically insulating material, with a plurality of apertures 44 formed therein is disposed on the exposed portions of first major surface 21 of first module 20, with apertures 44 disposed around components 54-56. Apertures 44 have dimensions that are slightly larger than the dimensions of the components 54-56 that they surround, and layer 45 may have a thickness that is the same or larger than the thickness of the thickest components (e.g., component 56), or the combined thickness of the thickest component and the underlying body 43 of conductive adhesive material. Layer 45 may comprise material pre-impregnated with adhesive resin that is partially cured (e.g., B-stage resin), or so-called "pre-preg" material. Subsequent heating of the layer, such as through a subsequent lamination process, allows the partially cured resin at the surfaces of layer 45 to adhere to major surface 21 of first module 20 and to second layer 46, and to fully cure in a state of adhesion to the first surface 21 of first module 20 and to second layer 46.

Figure 34:
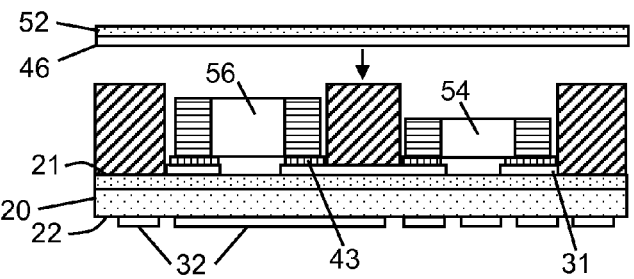
Figure 35:
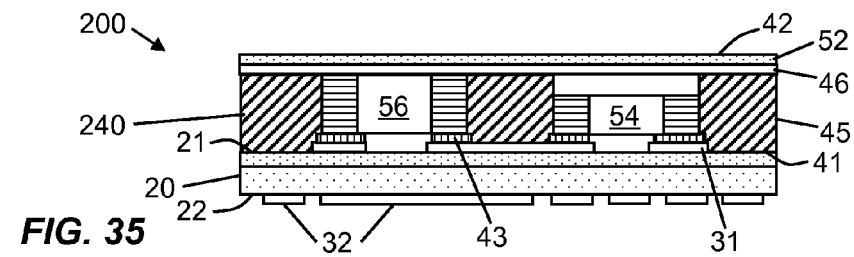

Referring to FIG. 34, a heat spreader layer 52 with underlying resin layer 46 is disposed over first layer 45 and components 54-56, and vacuum laminated thereto. The resulting package 200 is shown in FIG. 35. Resin layer 45 is electrically insulating, and may comprise a partially cured resin. Layer 52 may comprise a metal foil, such as a copper foil. The lamination process provides sufficient heat at elevated temperature to cause second layer 46 to adhere to first layer 45, components 54-56, and layer 52, and to cause first layer 45 to adhere to the exposed first major surface 21 of first module 20 and to second layer 46. Layers 46 and 52 may have the thicknesses previously-indicated above that may fill the gap between the component 54 and the layer 52 with resin layer 46 in curing process. In the case of larger gap between component 54 and the metal layer 52 with resin layer 46, one may add a process step of screening printing with a epoxy resin to fill the gap before placing the resin copper coating (RCC) with copper layer 52 and the resin layer 46.

Each of the above processes, taken individually, is known in the art and can be practiced by one of ordinary skill in the art without undue experimentation. In view of the disclosure herein, one of ordinary skill in the art will be able to practice the above combination and sequence of processes without undue experimentation. In addition, the above first modules, material layers and foil may be provided in strip forms that are processed in one or more chains of machinery such that the combined strips provide multiple instances of package 200, which can be separated (e.g., "singulated") from the combined strips at the ends of the processes or at a point during the sequence of processes. The strip processing enables the cost of production to be reduced.

Figure 36:
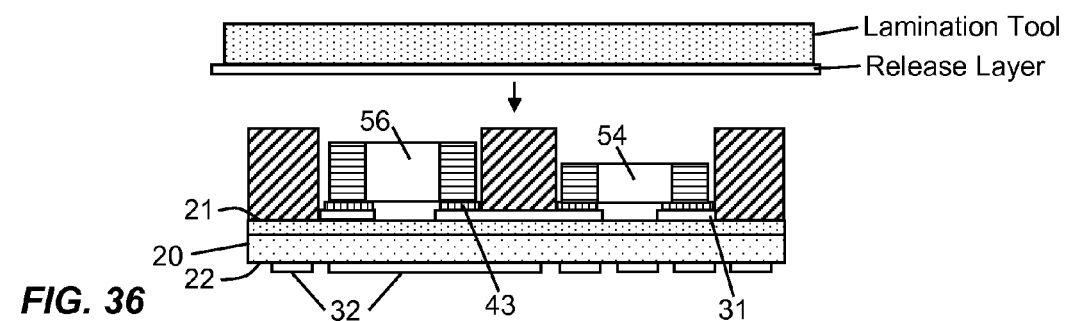
FIGS. 36-38 illustrate an exemplary method of manufacturing an exemplary modified second exemplary semiconductor die package according to the present invention.
Figure 37:
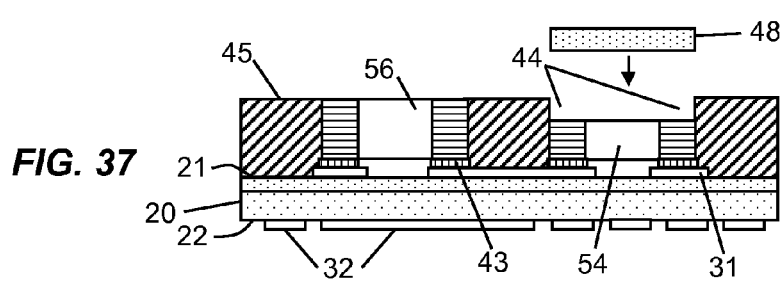
Figure 38:
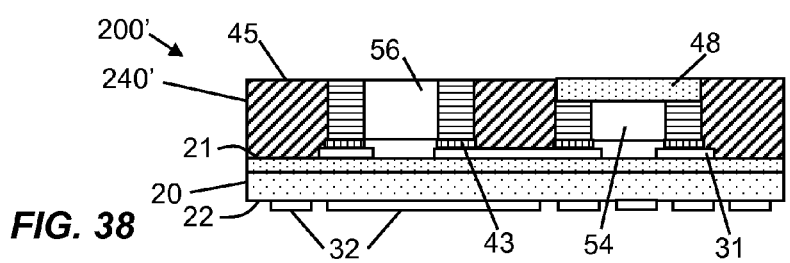

In a modified embodiment of package 200, heat spreader 52 is omitted from second module 240, with the top surface of the modified second module 240' (shown in FIG. 38) being the same as modified module 40' shown in FIG. 24. The top surface of the larger component 56 is left exposed. The top surfaces of the smaller components 54-55 may be covered by electrically insulating material 48 disposed at the tops of apertures 44. Second module 240' may be constructed with the processes illustrated in FIGS. 31-33 for module 240, and the further processes illustrated in FIGS. 36-38. After layer 45 is disposed on first major surface 21 of first module 20, it is laminated onto the major surface using a lamination tool and a release layer disposed between layer 45 and the lamination tool, as shown in FIG. 36. After the lamination process, the release layer is removed. The same lamination process described above for second module 40 may be used here. The height of layer 45 may be reduced to the height of the highest component 56, as shown in FIG. 37. Next, as shown in FIG. 37, insulating material 48 is disposed in the remaining portions of apertures 44, which are disposed over the smaller components 54-55, so as to fill the apertures, as shown in FIG. 38. For this, a resin may be screen printed on the top surface of layer 45, and thereafter cured. This completes module 240' and package 200', as shown in FIG. 38.

Figure 39:
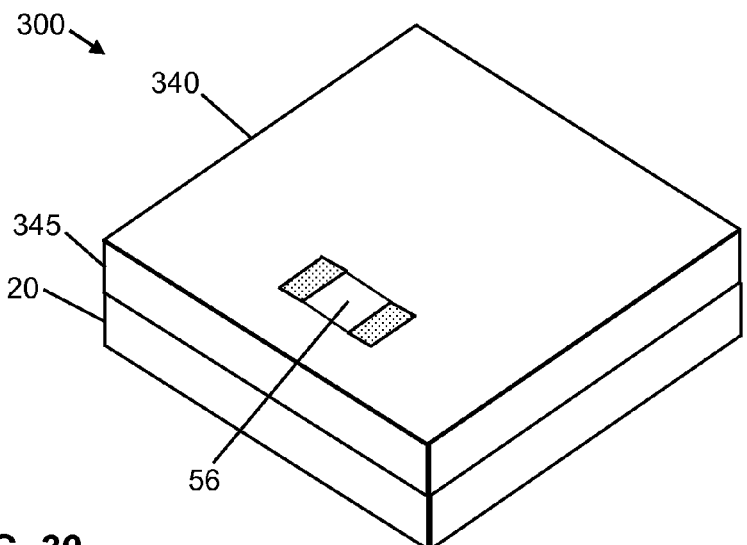
FIG. 39 shows a top perspective view of a third exemplary semiconductor die package according to the present invention.

In further package embodiments according to the present invention, the second module is formed over first substrate 20 in a manner that eliminates adhesive bodies 60 and lands 51 of the second module like module 240, uses a molded material in place of layer 45, and optionally omits heat spreader 52. This embodiment is illustrated as package 300 in FIG. 39, where a second module 340 is built on top of first module 20. The large component 56, which may comprise a surface-mounted inductor, has its top surface left exposed by the molding material at second major surface 42 of module 340. This enables a heat sink with a non-conductive surface to be attached to the top surface of the component for increased cooling efficiency. Package 300 uses the best advantages of both the embedded and molding processes for the particular dice and components to minimize overall costs. In this case, the molding process is used with surface-mounted components, rather than wirebond components, and can be done at a faster rate with higher levels of reliability since wirebond tearing is not a concern. One the other hand, more reliable interconnects are provided to the semiconductor dice by the embedded processes for the first module.

Figure 40:
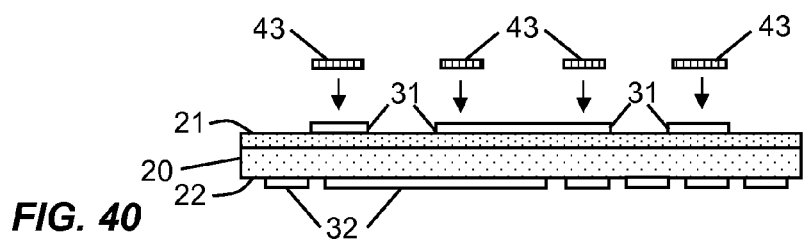
FIGS. 40-43 illustrate an exemplary method of manufacturing the third exemplary semiconductor die package according to the present invention.
Figure 41:
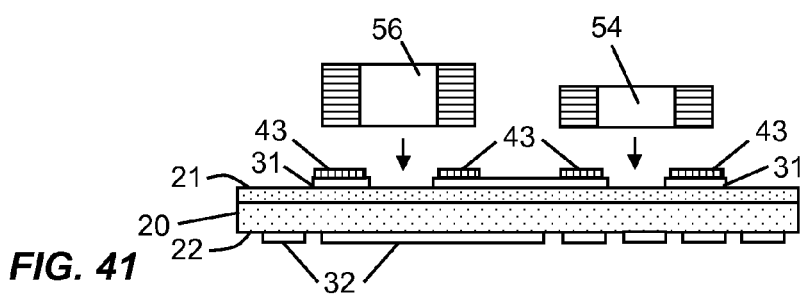

FIGS. 40-43 illustrate an exemplary method of manufacturing second module 340 and package 300. Referring to FIG. 40, bodies 43 of a conductive adhesive may be disposed on selected locations of lands 31 of first module 20 where the terminals of electrical components 54-56 are to be attached. Screen printing may be used for this. The conductive adhesive may comprise a conductive metal-filled epoxy (e.g., silver paste), or solder paste. Referring to FIG. 41, components 54-56 are disposed on selected lands 31 such that their terminals contact respective bodies 43 of conductive adhesive, and the conductive adhesive is solidified, such as by adhesive curing or solder reflow, both of which may be done by exposing the bodies 43 to elevated temperatures of over 170° C. As another approach, components 54-56 may comprise surface-mounted components that have terminals that are pre-coated with bodies 43 of adhesive material. In this case, components 54-56 can be disposed on selected lands 31 of first module 20 without having to first dispose bodies 43 on these lands; then, the conductive adhesive can be solidified as before.

Figure 42:
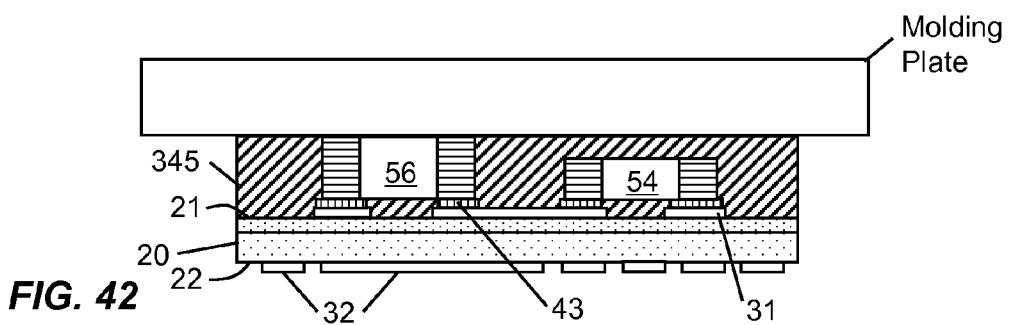
Figure 43:
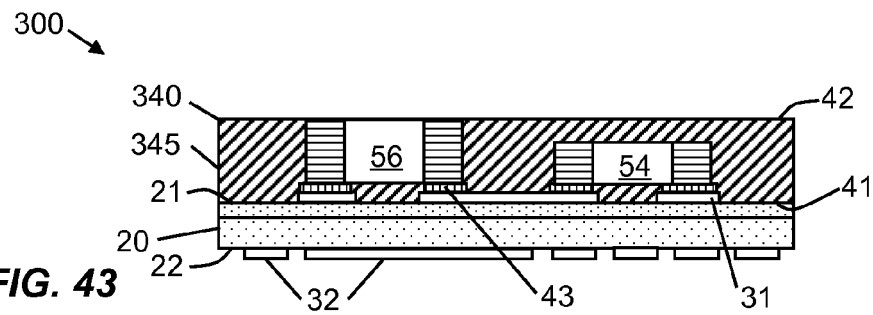

Referring to FIG. 42, a body 345 of electrically insulating molding material is disposed over major surface 21 of first module 20, and over and around components 54-56 in a conventional molding process which uses a molding plate to define the top surface of body 345. The sides of body 345 may be defined by protrusions in the molding plate, or several packages 300 and modules 340 may be manufactured together in a strip of packages and modules, and the sides of body 345 and modules 340 and 20 may be defined by cutting processes (e.g., singulation). A side view of the completed package 300 is shown in FIG. 43.

Figure 44:
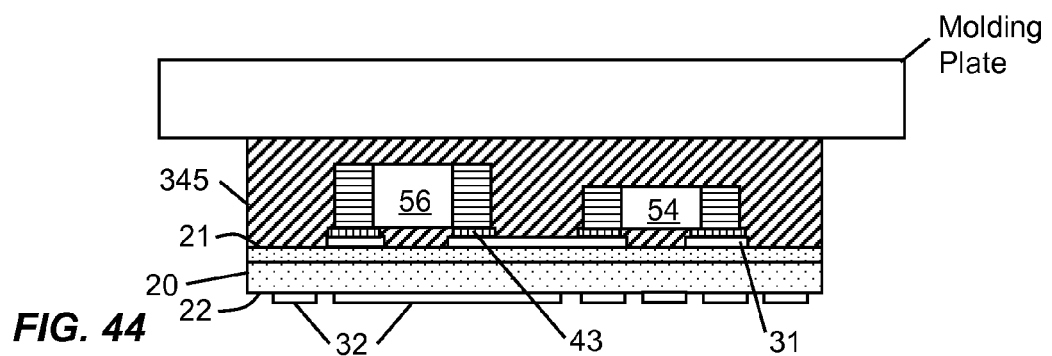
FIGS. 44-45 illustrate an exemplary method of manufacturing an exemplary modified third exemplary semiconductor die package according to the present invention.
Figure 45:
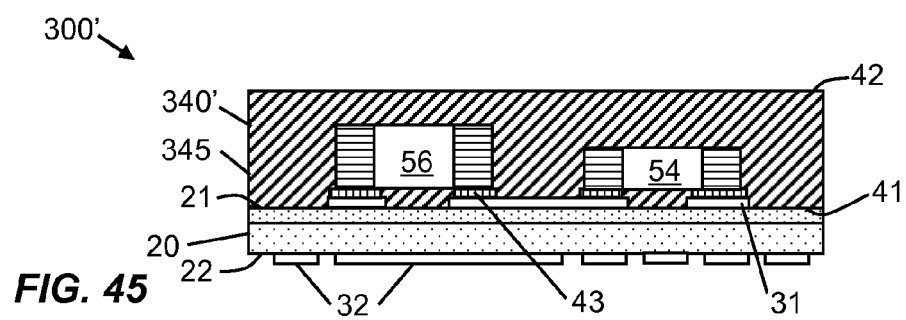

In a modification of package 300, the height of second module 340 is increased so as to cover the top surface of component 56, as shown by modified package 300' in FIG. 45. To do this, an upward adjustment of the molding plate is made during the molding process, as illustrated in FIG. 44.

In addition to the above noted advantages, packages 100, 200, and 300 have the advantage by providing high density and high reliable signal interconnects because of the foil and via construction, and because of the more condensed scale of the construction due to the smaller thicknesses of the foils (compared to lead frames) and smaller size of the vias. The smaller size also increases the electrical speed performance of the package due to the reduction in parasitic inductances and capacitances in the signal lines. In addition, excellent thermal performance is achieved due to heat spreader 52 (or the exposure of the electrical components) and the attachment of the semiconductor dice to large lands 31.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising: a first module comprising a package with at least one semiconductor device, said module having a first major surface, a second major surface, a plurality of first interconnect lands disposed at its first major surface, a plurality of second interconnect lands disposed at its second major surface, a first semiconductor die disposed between the first and second major surfaces, a first layer of electrically insulating material disposed between the first and second major surfaces and around the first semiconductor die, a second layer of electrically insulating material disposed between the first layer and the first major surface and over the first semiconductor die, a plurality of first electrically-conductive vias disposed through the second layer of electrically insulating material and electrically coupled to a plurality of conductive regions of the first semiconductor die, and a plurality of second electrically-conductive vias disposed through the first and second layers of electrically insulating material and electrically coupled to at least some of the second interconnect lands, wherein at least one first electrically-conductive via is electrically and conductively coupled to at least one second electrically conductive via, and wherein at least one second electrically-conductive via is electrically and conductively coupled to at least one first interconnect land; and a second module comprising a package with at least one electrical component, said second module, having a first major surface, a second major surface, a first electrical component disposed between the first and second major surfaces of the second module, a third layer of electrically insulating material disposed between the first and second major surfaces of the second module and around the first electrical component, wherein the second module is disposed over the first module with its first major surface facing the first major surface of the first module, and wherein the first electrical component is electrically coupled to the first semiconductor die by way of at least one of the first interconnect lands of the first module.

2. The semiconductor die package of claim 1, wherein the at least one first electrically-conductive via is electrically coupled to the at least one second electrically conductive via by an electrical signal trace disposed on the first major surface of the first module.

3. The semiconductor die package of claim 1, wherein first module further comprises:
a second semiconductor die disposed between its first and second major surfaces, the first layer of electrically insulating material further being disposed around the second semiconductor die and the second layer of electrically insulating material further being disposed over the second semiconductor die;
plurality of third electrically-conductive vias disposed through the second layer of electrically insulating material and electrically coupling to a plurality of conductive regions of the second semiconductor die; and
an electrical signal trace disposed on the first major surface of the first module and electrically coupled to a first electrically-conductive via and a third electrically-conductive via.

4. The semiconductor die package of claim 1, wherein the first and second interconnect lands have thicknesses of 40 microns or less.

5. The semiconductor die package of claim 1, wherein the first layer of electrically insulating material comprises a sheet of fibers that is impregnated with a liquid resin.

6. The semiconductor die package of claim 1, further comprising a metal layer disposed at the second major surface of the second module and over the first electrical component.

7. The semiconductor die package of claim 1, wherein the first electrical component has at least two electrical terminals that are disposed on and attached to respective first interconnect lands of the first module, and wherein the third layer of electrically insulating material comprises a molding material that is molded over the first electrical component and the second layer of electrically insulating material.

8. The semiconductor die package of claim 1, wherein the first electrical component has at least two electrical terminals that are disposed on and attached to respective first interconnect lands of the first module, and wherein the third layer of electrically insulating material is laminated to the second layer of electrically insulating material.

9. The semiconductor die package of claim 8, wherein the third layer of
electrically insulating material comprises a sheet of fibers that is impregnated with a liquid resin.

10. The semiconductor die package of claim 8, further comprising a forth layer of electrically-insulting material disposed over the third layer of electrically insulating material, and a layer of metal disposed over the fourth layer of electrically-insulting material.

11. The semiconductor die package of claim 8, wherein the second module further comprises:
A remaining aperture in the third layer of electrically insulating material, the aperture being located above the first electrical component; and
body of electrically insulating material disposed in the remaining aperture, the body and the third layer having different material compositions.

12. The semiconductor die package of claim 1, further comprising:
a plurality of third interconnect lands disposed at the first major surface of the second module, the first electrical component being electrical coupled to at least one of the third interconnect lands; and
a plurality of bodies of conductive adhesive disposed between a plurality of the third interconnect lands and a plurality of the first interconnect lands.

13. The semiconductor die package of claim 12, wherein the conductive adhesive comprises a solder with a first melting temperature, and wherein the first electrical component is attached to the at least one of the third interconnect lands by a solder material having a second melting temperature which is higher than the first melting temperature.

14. The semiconductor die package of claim 12, wherein at least one of the third interconnect lands is a dummy land that is not electrically coupled to any component in the second module.

15. The semiconductor die package of claim 12, wherein the second module further comprises:
a second electrical component disposed between its first and second major surfaces with the third layer of electrically insulating material being disposed around the second electrical component; and an electrical signal trace disposed at the first major surface of the second module and electrically coupled to the first and second electrical components.

16. The semiconductor die package of claim 12, wherein the second module further comprises:

a fourth layer of electrically insulating material disposed between the third layer of electrically insulating material and the second major surface of the second module, and over the first electrical component; and a metal layer disposed at the second major surface of the second module and over the first electrical component.

17. The semiconductor die package of claim 12, wherein the second module further comprises:

an aperture in the third layer of electrically insulating material, the aperture being located above the first electrical component; and body of electrically insulating material disposed in the aperture, the body and the third layer having different material compositions.

18. A method of manufacturing a semiconductor die package, the method comprising: (a) attaching a semiconductor die to a first conductive foil with a body of adhesive material; (b) disposing a first layer of electrically insulating material over the first conductive foil, the first layer having an aperture that fits around the semiconductor die; (c) disposing a composite layer of second conductive foil and an adhesive layer over the first layer with the adhesive layer facing the first layer, the adhesive layer providing a second layer of electrically insulating material; (d) laminating the first and second conductive foils and the first and second layers of electrically insulating material to form a first module and such that the first layer is adhered to the first conductive foil, the second layer is adhered to the first layer, and the second conductive foil is adhered to the second layer; (e) forming a plurality of first vias from the second conductive foil to a plurality of conductive regions of the semiconductor die and a plurality of second vias from the second conductive foil to the first conductive foil; and (f) pattern etching the first and second conductive foils to form a plurality of first interconnect lands from the second conductive foil, a plurality of second interconnect lands from the first conductive foil, and at least one electrical signal trace from the second conductive foil that electrically and conductively interconnect a first via to a second via.

19. The method of claim 18, further comprising attaching a second module to the first module such that a plurality of interconnect lands disposed on a first major surface of the second module are attached and electrically coupled to corresponding first interconnect lands of the first module, wherein the second module comprises a package with an electrical component.

20. The method of claim 18, further comprising:

(g) attaching an electrical component to a third conductive foil with a body of adhesive material;

(h) disposing a third layer of electrically insulating material over the third conductive foil, the third layer having an aperture that fits around the electrical component;

(i) disposing a composite layer of fourth conductive foil and an adhesive layer over the third layer with the adhesive layer facing the third layer, said adhesive layer providing a fourth layer of electrically insulating material;

(j) laminating the third and fourth conductive foils and the third and fourth layers of electrically insulating material to form a second module and such that the third layer adheres to the third conductive foil, the fourth layer adheres to the third layer, and the fourth conductive foil adheres to the fourth layer;

(k) pattern etching the third conductive foil to form a plurality of third interconnect lands from the third conductive foil; and (l) attaching the second module to the first module such that a plurality of third interconnect lands are attached and electrically coupled to corresponding first interconnect lands of the first module.

21. The method of claim 18, further comprising:

attaching a plurality of terminals of an electrical component to respective first interconnect lands of the first module with conductive adhesive such that the terminals are electrically coupled to said first interconnect lands;

disposing a third layer of electrically insulating material over the second layer of electrically insulating material, the third layer having an aperture that fits around the electrical component;

disposing a composite layer of third conductive foil and an adhesive layer over the third layer with the adhesive layer facing the third layer, said adhesive layer providing a fourth layer of electrically insulating material; and laminating the third conductive foil and the third and fourth layers of electrically insulating material with the second layer of electrically insulating material to form a second module that is laminated to the first module and such that the fourth layer is adhered to the third conductive foil, and the third layer is adhered to the second and fourth layers.

22. The method of claim 18, further comprising:

attaching a plurality of terminals of an electrical component to respective first interconnect lands of the first module with conductive adhesive such that the terminals are electrically coupled to said first interconnect lands; and disposing a body of electrically insulating molding material over the second layer of electrically insulating material and at least around the side of the electrical component.

23. The method of claim 18, further comprising:

(g) attaching an electrical component to a third conductive foil with a body of adhesive material;

(h) disposing a third layer of electrically insulating material over the third conductive foil, the third layer having an aperture that fits around the electrical component;

(i) laminating the third conductive foil and the third layer of electrically insulating material together to form a second module and such that the third layer adheres to the third conductive foil;

(j) pattern etching the third conductive foil to form a plurality of third interconnect lands from the third conductive foil; and (k) attaching the second module to the first module such that a plurality of third interconnect lands are attached and electrically coupled to corresponding first interconnect lands of the first module.

24. The method of claim 23, wherein the third layer of electrically insulating material has a remaining aperture located above the first electrical component after the third conductive foil and the third layer are laminated together; and wherein the method further comprises disposing a body of electrically insulating material in the remaining aperture, the body and the third layer having different material compositions.

25. The method of claim 18, further comprising:
attaching a plurality of terminals of an electrical component to respective first interconnect lands of the first module with conductive adhesive such that the terminals are electrically coupled to said first interconnect lands;
disposing a third layer of electrically insulating material over the second layer of electrically insulating material, the third layer having an aperture that fits around the electrical component;
laminating the third layer of electrically insulating material with the second layer of electrically insulating material to form a second module that is laminated to the first module and such that the third layer is adhered to the second layer.

26. The method of claim 25, wherein the third layer of electrically insulating material has a remaining aperture located above the first electrical component after the third layer of electrically insulating material is laminated with the second layer of electrically insulating material; and
wherein the method further comprises disposing a body of electrically insulating material in the remaining aperture, the body and the third layer having different material compositions.

\* \* \* \* \*